United States Patent [19]

Schlemmer

[11] Patent Number: 5,248,193
[45] Date of Patent: Sep. 28, 1993

[54] EXTRUDED ENCLOSURE FOR A COMPUTER SYSTEM

[75] Inventor: James L. Schlemmer, Sugar Land, Tex.

[73] Assignee: Texas Microsystems, Inc., Houston, Tex.

[21] Appl. No.: 779,392

[22] Filed: Oct. 18, 1991

[51] Int. Cl.$^5$ ............................................. A47B 81/00
[52] U.S. Cl. .................... 312/223.2; 312/263; 248/615; 248/921
[58] Field of Search ............... 312/208.1, 208.4, 257.1, 312/263, 265.5, 265.6, 223.1, 223.2; 248/919, 917, 921, 922, 615, 677; 364/708; 220/4.02, 4.32; 361/340, 380, 390, 393, 394, 395, 399

[56] References Cited

U.S. PATENT DOCUMENTS

| | | | |
|---|---|---|---|
| 2,177,170 | 10/1939 | Chapel | 248/615 |
| 4,356,531 | 10/1982 | Marino et al. | 312/265.5 X |
| 4,471,898 | 9/1984 | Parker | 220/4.02 X |
| 4,832,419 | 5/1989 | Mitchell et al. | 361/380 X |

*Primary Examiner*—Kenneth J. Dorner
*Assistant Examiner*—Brian K. Green
*Attorney, Agent, or Firm*—Vinson & Elkins

[57] ABSTRACT

An enclosure for a computer system is disclosed, which has the capability of being used in a desktop, tower or rack-mount configuration. The enclosure includes side extrusions having a center portion and two end portions which are substantially perpendicular to the center portion. Foot grooves are located on the end portions and on the center portion near each corner, and center grooves are located along the wider center portion. Pliable feet may be slid into position into foot grooves of the end portions of both side extrusions, in the desktop configuration. The tower configuration may be obtained by installing support feet which wrap around the corner of the side extrusion, mating in both the foot grooves on the end portions and those in the center portion of the side extrusion. The disclosed enclosure also enables rack-mounting by way of rack slides mounted into the center grooves of the center portion of the side extrusions. Flexibility in deployment of a computer contained within such an enclosure is obtained by way of the disclosed construction.

7 Claims, 6 Drawing Sheets

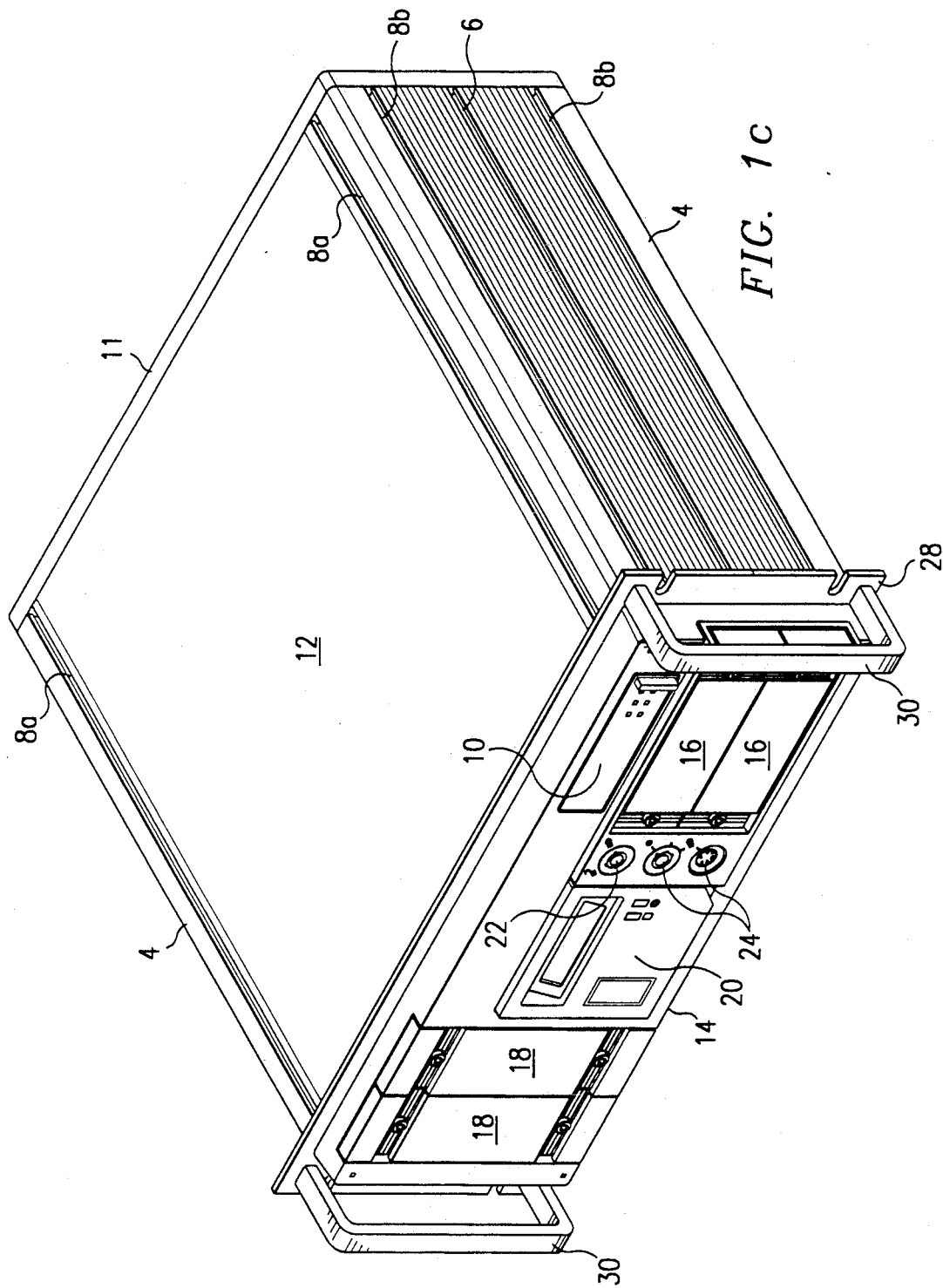

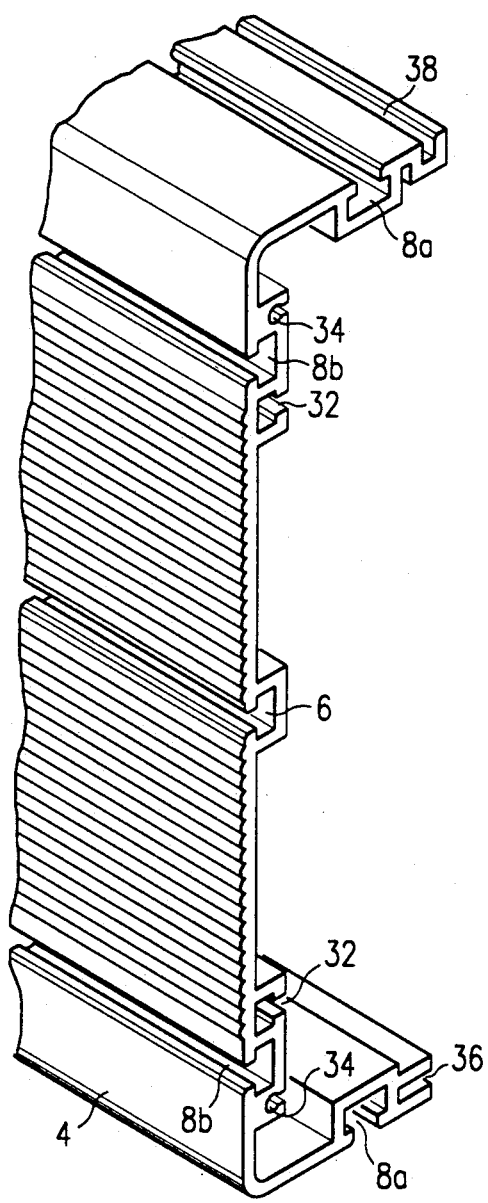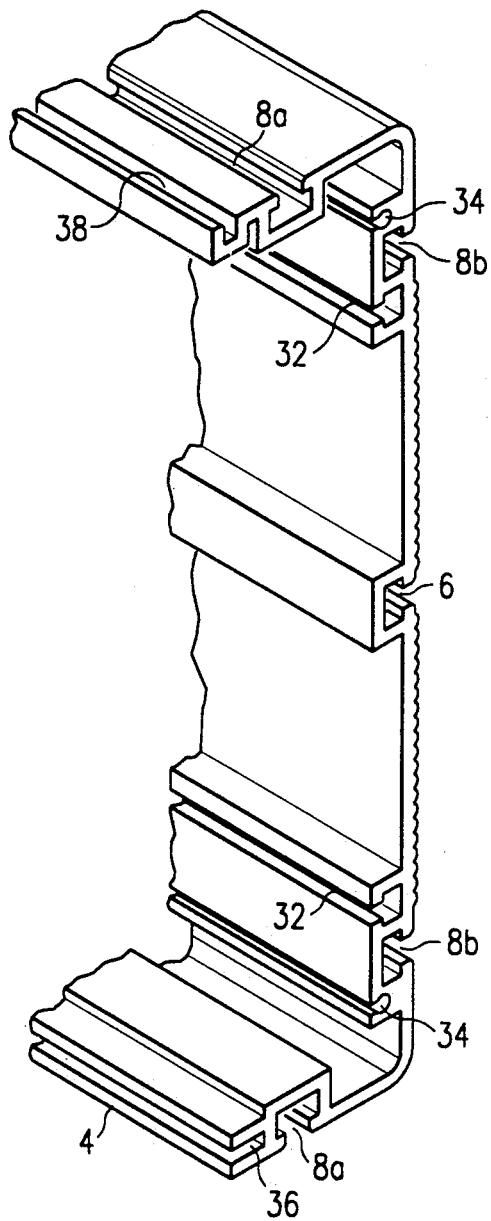
FIG. 2a
FIG. 2b

EXTRUDED ENCLOSURE FOR A COMPUTER SYSTEM

This invention is in the field of computer systems, and is more particularly directed to enclosures or cases for such systems.

BACKGROUND OF THE INVENTION

Modern personal computers and workstations generally include the more important functional components in a single case. These components include power supplies, disk storage (both fixed disk and removable, or floppy disk drives), tape drives, and one or more printed circuit boards upon which are mounted the central processing unit, memory, and other integrated circuits used in data processing. In many office and home environments, the case is configured to be placed in a horizontal ("desktop") position, generally with the cathode ray tube (CRT) monitor placed thereupon. High performance personal computers, particularly workstations for computer-aided-design and other computationally-intensive tasks, often require larger cases in order to house additional circuit and storage functions. These high performance computers often include cases in the so-called "tower" configuration, with the case intended to sit in a vertical position on the floor under or adjacent the user's desk. A third environment into which personal computers and workstations are placed are in a factory or other control environment. The case for such computers is often configured so as to be mounted in an instrumentation rack using rack slides mounted along the sides of the case.

Heretofore, each of the three configurations (desktop, tower, rack) have had specific case designs therefor. Particularly in the case of rack-mounted computers, the purchaser may be limited in the choice of computer model and performance for a particular case design. The design of the computer enclosure also limits the ability to re-deploy a computer workstation in a different environment. In addition, manufacturers of computer systems that serve all three markets must maintain an inventory of the three case designs, using the particular cases according to demand. Dedicated case designs thus limit the use and manufacturability of computers, for both the purchaser and the manufacturer.

In addition, many new personal computer systems and workstations are being purchased for more "rugged" environments. For example, a factory or on-site control application can expose the computer to significantly stronger mechanical shocks, at a higher frequency, than that to which computers in an office environment are exposed. Enclosures for computers intended for use in factories, aircraft, and other hostile environments must thus provide strength against mechanical shocks and forces.

By way of further background, extrusion sides and cases for electronic instrumentation are known. Such extrusions include interior grooves into which printed circuit boards and other internal components may be mounted. Examples of such conventional extrusions now available include the "MICRO-PAK" enclosures sold by Lansing Instrument Corp., system cases sold by Schroff Inc., "FLEXIBOX" enclosure systems from Powerbox, and ERB and ECR model cases sold by The Buckeye Stamping Company. However, conventional extrusions do not provide flexibility of configuration, as extrusions for rack-mounted equipment differ from desktop or "tower" configuration cases, much less provide structural support in the various configurations.

It is therefore an object of this invention to provide an enclosure for a personal computer or workstation which can be deployed in a desktop, tower or rack-mounted environment.

It is a further object of this invention to provide such an enclosure which includes extruded aluminum sides of sufficient strength to support internal components and to shield the components from mechanical shock.

It is a further object of this invention to provide such an enclosure which includes such side extrusions which allow for desktop, tower or rack-mounted deployment.

Other objects and advantages of the present invention will be apparent to those of ordinary skill in the art having reference to the following specification together with the drawings.

SUMMARY OF THE INVENTION

The invention may be incorporated into a computer enclosure having sides formed of extruded aluminum. The sides are formed into a C-shaped structure, providing not only side enclosures but also providing structural support to the computer itself. Each of the extruded sides include grooves on either side of each corner, into which elongated pliable "feet" may be slid. The desktop configuration is obtained by installing the feet in the grooves along the narrow end portion of each of the two extrusions. The tower configuration is obtained by installing tower support feet into the grooves on the wider center portion of one side extrusion; additional support may be obtained by using feet which mate into both the bottom grooves and those along the narrow end portion of the side extrusion. Rack-mounting is obtained by installing rack slides into a center exterior groove along the wider center portion of each of the extrusions. Interior grooves are provided for mounting internal computer components to the side extrusions.

BRIEF DESCRIPTION OF THE DRAWINGS

FIGS. 1a, 1b and 1c are perspective views of the computer enclosure according to the present invention in the desktop, tower and rack-mounted configurations respectively.

FIGS. 2a and 2b are perspective exterior and interior views, respectively, of an end portion of one of the extrusions of the enclosure of FIGS. 1a through 1c.

DETAILED DESCRIPTION OF THE PREFERRED EMBODIMENT

Figure 1A:
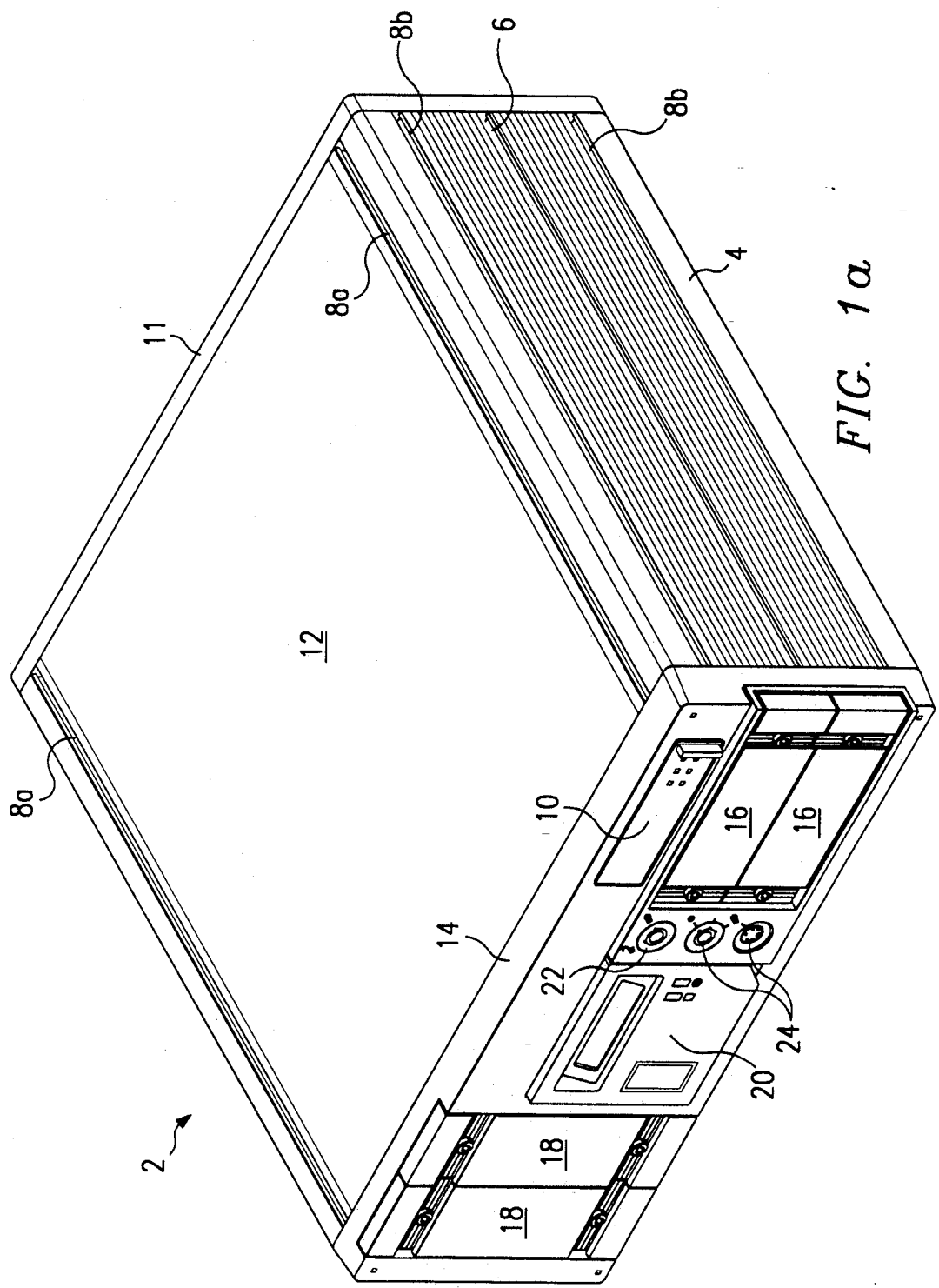

Referring first to FIG. 1a, computer 2 will be described relative to its desktop configuration. In this embodiment of the invention, side extrusions 4 serve to support front panel 14 and rear panel 11. As will be described in further detail hereinbelow, side extrusions 4 have exterior grooves 8a, 8b which may receive feet for supporting the weight of computer 2 on a desktop or other surface, and also include interior grooves and mounting locations for supporting internal components and circuit boards therein. Accordingly, it is preferred that side extrusions 4 consist of a relatively high strength metal, for example aluminum, which is formed by way of extrusion through a die having the desired cross-sectional shape. While extrusion is the preferred process for the formation of side extrusions 4 in a manner suitable to achieve the functions described herein, other techniques for forming sides 4 may alternatively be used, such methods including forming metal, molding plastic, and the like.

Each of side extrusions 4 include center groove 6 along its exterior side; as will be described hereinbelow, center groove 6 can receive a rack mounting slide for mounting computer 2 into an industry-standard rack. Each of side extrusions 4 further include foot grooves 8a running the length of each of its narrower end portions (i.e., the top and bottom of computer 2 in FIG. 1a, the bottom not being shown). Each of side extrusions 4 further include two foot grooves 8b running along the length of its wider center portion, preferably spaced from the top and bottom corners, respectively, by approximately the same distance that foot grooves 8a are spaced therefrom. In the configuration of FIG. 1a, pliable feet (not shown) are in place in foot groove 8a of each side extrusion 4 which is on the bottom of computer 2, for supporting computer 2 from the desktop or other work surface.

Front panel 14 is attached into side extrusions 4 by way of screws or other conventional fasteners. In this example, certain of the components in computer 2 are modular and may be removed and replaced from the front. These modular components include power supplies 18 and fixed disk drives 16, each of which have front-accessible handles by which they may be pulled out from computer 2. Front panel 14 also includes slidable door 10 through which a floppy disk drive is accessible. LCD status panel 20 is also provided in front panel 14 by which computer 2 presents status messages to the user; as will be noted hereinbelow, LCD panel 20 is preferably mounted by way of push-pins which mate with sockets in front panel 14, to allow for its removal and re-orientation if desired. Lock 22 mechanically locks power supplies 18, fixed disk drives 16, and top cover 12 so that they cannot be removed, and also locks door 10 so that it cannot be opened. Lock 22 thus secures computer 2 not only against component removal, but also against removal of data therefrom onto a floppy disk. Lock 23 is also provided to provide keyed control for the turning on and off of power to computer 2; in this example, lock 23 operates in three positions, including power on, power off, and power on with the keyboard disabled. Front panel 14 also includes access port 24 into which a keyboard may be installed.

The case of computer 2 also includes top panel 12 which slides into grooves of side extrusions 4 as will be described in further detail hereinbelow; a bottom pan (not shown in FIG. 1a) also slides into side extrusions 4. Rear panel 11 fits over side extrusions 4 and fastens thereinto by screws.

According to this embodiment of the invention, side extrusions 4 allow for the deployment of computer 2 in desktop, tower or rack-mount configurations. Accordingly, the size of computer 2 is preferably compatible with standard instrument racks; an example of such a standard size is 19 inches wide by 7 inches high by 20 inches deep. Of course, the present invention is also beneficial for computer enclosures of other standard, and non-standard, sizes.

Figure 1B:
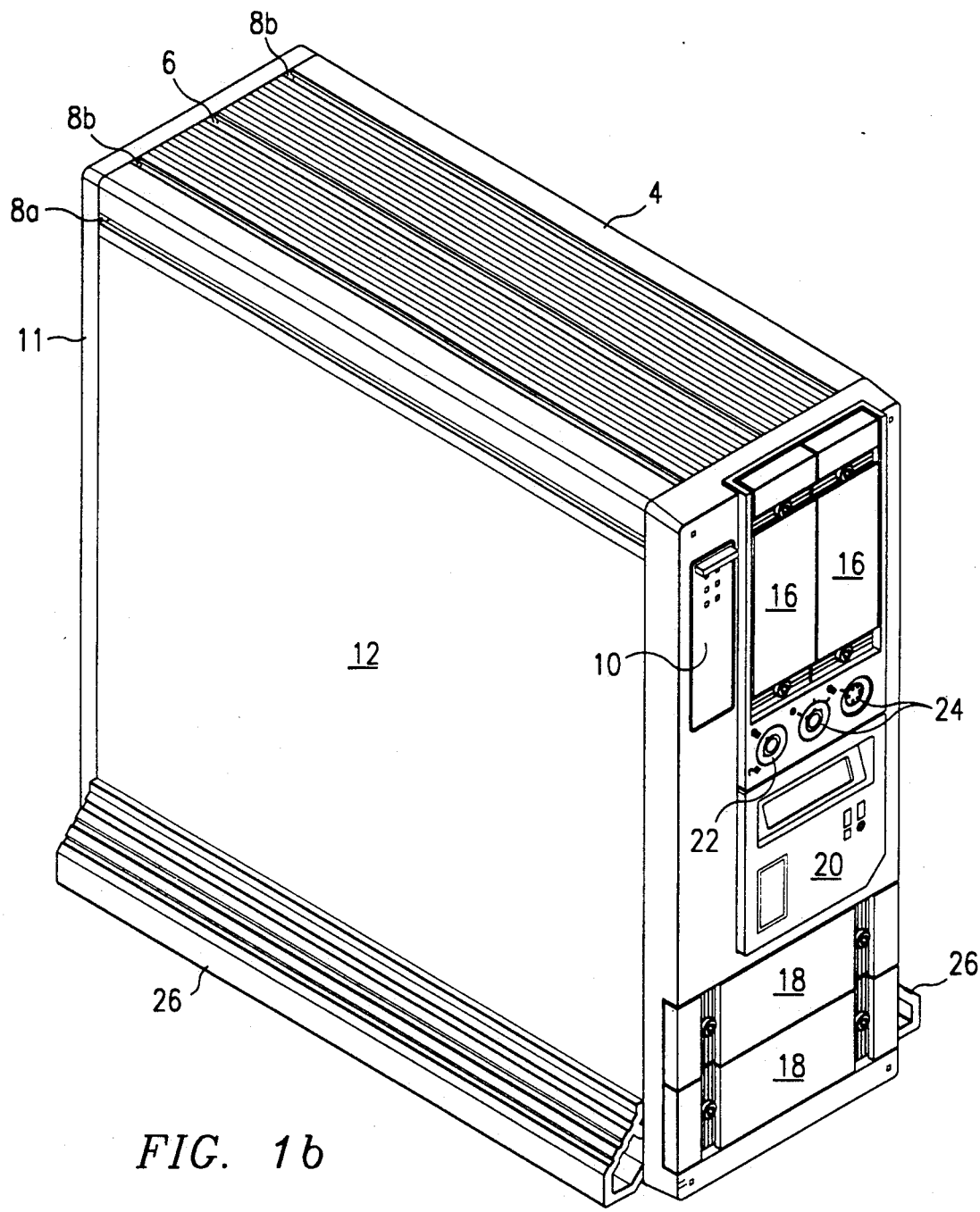

Referring now to FIG. 1b, computer 2 in its tower configuration will now be described. In the tower configuration, computer 2 includes the same components as in the desktop configuration described hereinabove relative to FIG. 1a. In this embodiment of the invention, LCD panel 20 is turned 90° from that in the desktop configuration of FIG. 1a. As noted hereinabove, LCD panel 20 is mounted into front panel 14 by way of push-pins mating into panel sockets (with the electrical connection thereto made by way of flexible wiring), so that the turning of LCD panel 20 may be accomplished by merely pulling it away from front panel 14, turning it 90° in the desired direction, and replacing it into the sockets.

Also provided in the tower configuration of computer 2 shown in FIG. 1b are tower support feet 26. Tower support feet 26 are preferably formed of pliable material, such as rubber or plastic, to provide stability. Tower support feet 26 slidably mate with grooves 8a and 8b of one of side extrusions 4, in particular the side extrusion 4 which is to serve as the bottom of computer 2, and preferably run substantially the length of side extrusion 4 between front panel 14 and rear panel 11. The mating of tower support feet 26 with grooves 8b in the side extrusion 4 serving as the bottom of computer 2 is apparent from FIG. 1b; tower support feet 26 also preferably wrap under the corner of side extrusion 4, however, to also mate into grooves 8a thereunder, to add additional support to computer 2.

Referring now to FIG. 1c, computer 2 in its rack-mount configuration will now be described in detail. In this example, computer 2 is intended to mate into a standard rack, for example an EIA standard 19" by 7" rack panel. Computer 2 in the rack-mount configuration includes the same components as in the desktop and tower configurations, except for pliable support feet and tower support feet 26, which are not necessary in the rack-mount configuration. Computer 2 of FIG. 1c further includes rack plate 28 which is mounted between front panel 14 and side extrusions 4, for example by screws into side extrusions 4; rack plate 28 has handles 30 mounted thereupon to facilitate the mounting and removal of computer 2 into and from the desired rack location.

As noted hereinabove, side extrusions 4 each include center grooves 6. Center grooves 6 are of such size as to be able to receive conventional rack slides, for mating with the slides in the instrument rack into which computer 2 is to be installed. Such rack slides structurally support computer 2 within the instrument rack, in the conventional manner.

As is evident in each of the three configurations described hereinabove, side extrusions 4 provide the structural support required for the installation or deployment of computer 2 into its desired location. When configured either as a desktop or as a tower, support feet necessary for stable and sound support of computer 2 are mounted within grooves 8a, 8b, and when rack-mounted, side extrusions 4 receive the rack slides into grooves 2 therein and support computer 2 in an instrument rack. Since side extrusions 4 serve not only as side panels, but also as the corners of the completed enclosure, side extrusions 4 according to the present invention thus structurally support computer 2 in three possible configurations, without requiring different extrusions or enclosures for the different configurations. As a result, the computer manufacturer need not design and maintain inventory of multiple enclosure types for the different configurations. In addition, the computer purchaser may deploy, or re-deploy, computer 2 according to this embodiment of the invention in any of the configurations by merely adding the appropriate feet or slides.

Referring now to FIGS. 2a and 2b, the construction of one of side extrusions 4 will be described in further detail. The two side extrusions 4 utilized in a single computer 2 are preferably identical with one another, with their orientation determining whether they are for the left or right side of the case, for best manufacturing efficiency. As will be noted hereinbelow, as different grooves may be used for the top and bottom panels, it is therefore preferable that the grooves formed in side extrusions 4 extend along their full length; such construction is, of course, compatible with the extrusion manufacturing process used to form side extrusions 4.

As shown in FIGS. 2a and 2b, the exterior of the inner center portion of side extrusion 4 includes center groove 6 and two foot grooves 8b. One foot groove 8a is formed into the exterior of each of the two narrower end portions of side extrusions 4, such narrower end portions substantially perpendicular to the wider center portion of each side extrusion 4. It is preferred, from the standpoint of structural soundness, that foot grooves 8a be located at approximately the same distance from the corner of side extrusion 4 as foot grooves 8b; in this way, the installation of pliable feet into either of grooves 8a, 8b will provide equivalent stability. Each of grooves 6, 8a, 8b are on the order of 0.180 inches wide at the surface, and are of a T-shape so as to have a width of 0.280 inches in their interior. Such T-shaped construction allows for secure installation of pliable feet and the like, having mating T-shaped protrusions therefrom which can be slid into the desired foot groove 8a, 8b from one end. Once installed, the mating T-shaped protrusions prevent their easy removal from foot grooves 8a, 8b. For the case of conventional rack slides to be mounted into center groove 6, preferably a metal plate is included in the rack slide which mates with the T-shaped center groove 6, allowing it to be slid into center groove 6 and securely maintained therein.

Side extrusion 4 further includes component grooves 32 on its interior surface to which internal components may be fixably mounted. Component grooves 32 are also preferably T-shaped, so that they can receive conventional sliding clips into which screws or other fasteners may be mounted. Component grooves 32 thus allow for the placement of circuit boards, power supply assemblies and the like to side extrusions 4, and thus to the primary structural member of the enclosure of computer 2. As such, side extrusions 4 may bear at least some of the weight of the components in computer 2, particularly heavier components such as power supplies, rather than having a thin bottom panel support such components. Since side extrusions 4 either have feet or rack slides mounted thereinto, the weight of the mounted components is thus borne by the support structure provided by side extrusions 4.

Side extrusion 4 also includes panel grooves 36, 38 for holding top panel 12 and a bottom panel (not shown), respectively. In this embodiment of the invention, one of the narrower end portions of side extrusion 4 includes panel groove 38, which has its opening parallel to foot groove 8a, for receiving a flat top panel 12 therein. The other narrower end portion of side extrusion 4 includes panel groove 36, which has its opening perpendicular to groove 8a, for receiving folded edges of a bottom panel, or pan. The use of folded edges of the bottom panel mating with panel groove 38 provides for structurally sound installation of the bottom panel, while the perpendicular opening in panel groove 36 facilitates removal of top panel 12 after rear panel 11 has been removed, for ease of service.

Screw holes 34 are also provided at the top and bottom of the wider center portion of side extrusion 4, for the attachment of front panel 14 or rear panel 11 thereto. Screw hole 34 has an open side (facing the interior of side extrusion 4), and as such is adapted to receive a self-tapping screw from the end, by which the front panel 14 or rear panel 11, as the case may be, can be fastened to side extrusions 4.

Figure 3:
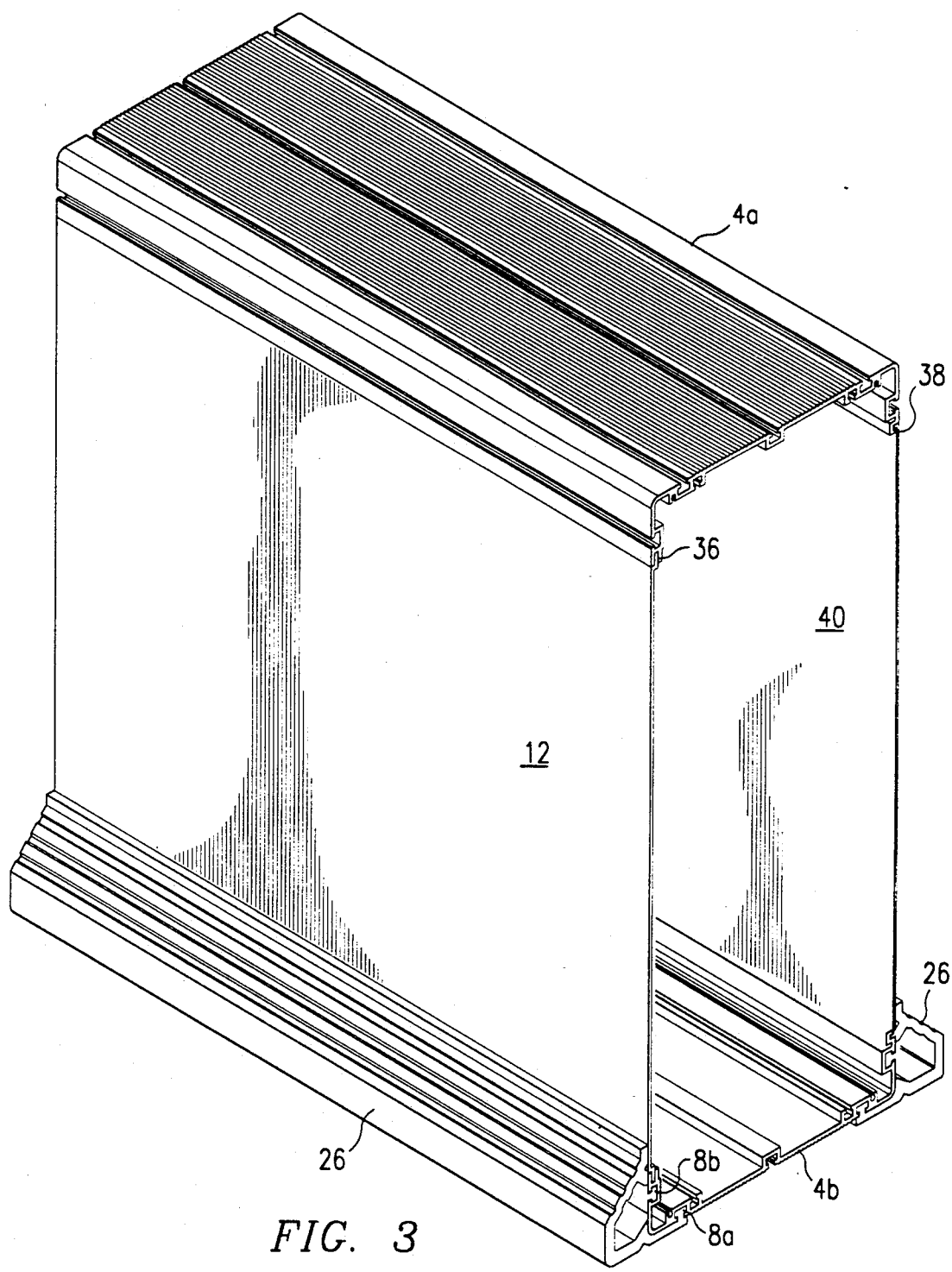
FIG. 3 is a perspective view of an enclosure according to the preferred embodiment of the invention, in a tower configuration, and at a selected stage during its assembly.

Referring now to FIG. 3, a view of side extrusions 4 with tower support feet 26 installed therein will now be described in detail. In the state illustrated in FIG. 3, top panel 12 (serving as a side) and bottom panel 40 (serving as an opposing side) are installed into place into panel grooves 36 and 38, respectively, of side extrusions 4a, 4b. At the state shown in FIG. 3, front panel 14 and rear panel 11 are not yet installed, nor are any of the internal components of computer 2 installed thereinto. Side extrusion 4a serves as the top of the unit in this tower configuration, and side extrusion 4b serves as the bottom of the tower configuration.

According to this preferred embodiment of the invention, tower support feet 26 wrap around the corners of bottom side extrusion 4b in FIG. 3. T-shaped protrusions from each of tower support feet 26 mate with, and are in place into, both foot groove 8a and foot groove 8b of side extrusion 4b at its associated corner. As noted hereinabove, the preferred method of installation of tower support feet 26 is to slide feet 26 from one end of bottom side extrusion 4b, prior to the installation of either or both of front panel 14 and rear panel 11, with the T-shaped extrusion mating with T-shaped foot grooves 8a, 8b as it is slid therealong.

As shown in FIG. 3, in this configuration of the preferred embodiment of the invention, sound structural support is provided for computer 2 by side extrusions 4a, 4b, together with tower support feet 26 wrapping around a corner of side extrusion 4b and inserted into grooves 8a, 8b on both sides thereof. It should be noted that the tower configuration could be obtained by merely placing pliable feet into foot grooves 8b of side extrusion 4b, as this would provide a resilient interface between computer 2 and its resting surface. In this preferred embodiment of the invention, however, the wrap-around tower support feet 26 of FIG. 3 provides resilient support of computer 2 on the floor or other resting surface by way of the portion underlying side extrusion 4b and mated with foot groove 8b, and also lateral support against tipping by way of the portion extending vertically and mating with foot groove 8a.

Figure 4:
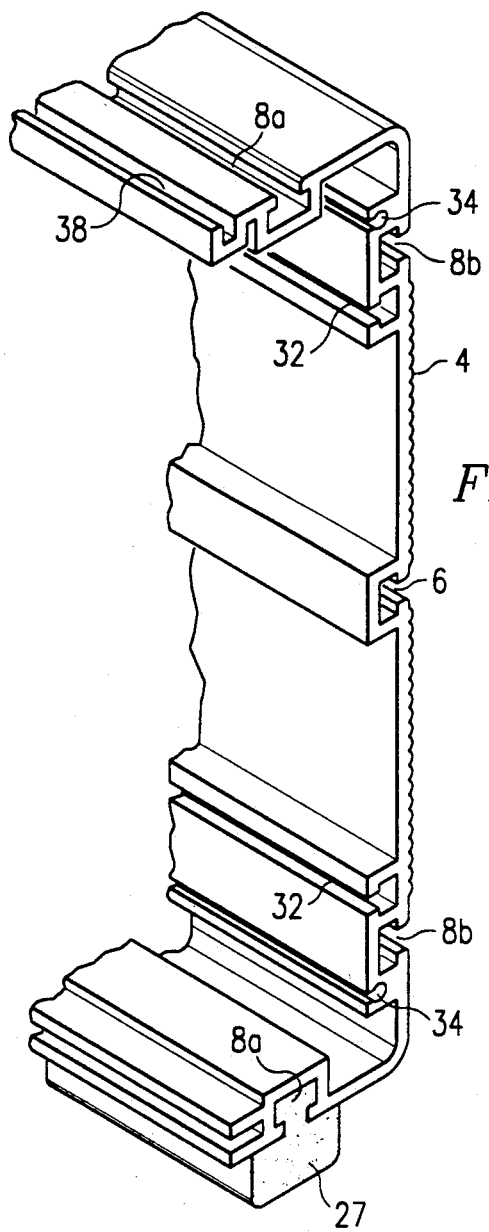
FIG. 4 is a perspective interior view of an end portion of one of the extrusions of the enclosure of FIG. 1a, illustrating the location of a foot therewithin.

Referring now to FIG. 4, an interior view of one of side extrusions 4 is illustrated, particularly relative to the desktop configuration shown in FIG. 1a. In this view of FIG. 4, support foot 27 is in place within groove 8a on the exterior surface of the bottom narrower end portion of extrusion 4. Support foot 27 is preferably formed of a pliable material such as rubber or plastic, and has a T-shaped extension therefrom which mates with the dimensions of groove 8a as shown in FIG. 4. For purposes of stability, it is preferable that support foot 27 extend along substantially the full length of extrusion 4. As such, support foot 27 is preferably a single extruded or molded rubber or plastic member of the appropriate shape, of a length approximately that of extrusion 4. Support foot 27 may be installed by sliding it into groove 8a from one end of extrusion 4, prior to attachment of front panel 14 and rear panel 11.

As noted hereinabove, implementation of computer 2 in the rack-mounted configuration, as shown in FIG. 1c, may be accomplished by the insertion of conventional rack mounting slides into groove 6 in the exterior of the wider center portion of extrusions 6. Preferably, the rack mounting slides also extend for substantially the full length of extrusion 4, for best stability. As is conventional in the art, such rack mounting slides may be installed by sliding them into groove 6, for example from the rear of extrusions 4 with rear panel 11 removed.

Figure 5:
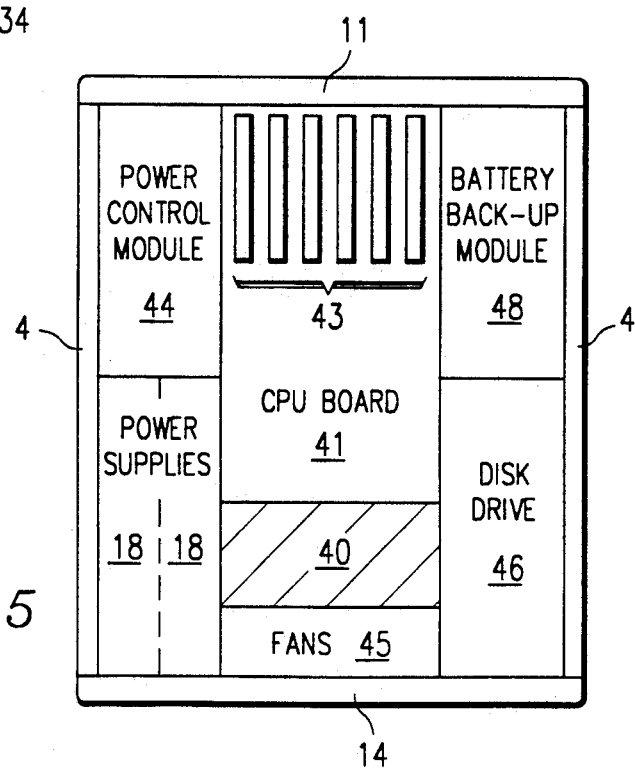
FIG. 5 is a plan view, in block form, of the interior of a computer according to the preferred embodiment of the invention, illustrating the location of various components therewithin.

Referring now to FIG. 5, an example of the location of components of computer 2 when installed between extrusions 4 is illustrated. Of course, the benefits of the invention may be obtained regardless of the actual location of the various components therewithin; the location of such components illustrated in FIG. 5 is therefore presented by way of example only.

The illustration of FIG. 5 shows the interior of computer 2 with top panel 12 removed, and with front panel 14 and rear panel 11 in place. Consistent with the views of FIGS. 1a through 1c, power supplies 18 are located near front panel 14, and are adjacent one another. Power supply control module 44 is located behind power supplies 18, and includes the necessary control electronics and bussing to control the distribution of power to the other components of computer 2. Along the right-hand side (as shown in FIG. 5) of computer 2, floppy disk drive 46 extends toward front panel 14, in cooperation with door 10 illustrated in FIGS. 1a through 1c; fixed disk drives 16 (shown in FIGS. 1a through 1c) are disposed under floppy disk drive 46. Also in this example, battery backup module 48 is located behind disk drives 16, 46; a spare fixed disk drive may also be located at this location. Each of power supplies 18, power supply module 44, disk drives 16, 46, and battery backup module 48 preferably mount, in the conventional manner, to grooves 32 on the interior of extrusions 4.

As illustrated in FIG. 5, this example of computer 2 further includes cooling fans 45 located near front panel 45. CPU board 41 is located between extrusions 4, extending below power control module 44 and battery backup module 48 if desired. For example, CPU board 41 may be supported from interior grooves 32 of extrusions 4; alternatively, CPU board 41 may be supported from bottom panel 40 (a portion of which shows through as illustrated in FIG. 5, in the example where CPU board 41 does not fully extend to front panel 14). Mounted onto CPU board 41 are the appropriate components useful in conventional computers, including one or more microprocessors, memory devices, and the like. Expansion slots 43 are provided near the rear of CPU board 41 to provide back-plane access in the conventional manner. In this example, cooling fans 45 force air toward rear panel 11, through any expansion cards which may be installed into expansion slots 43.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An enclosure for a computer, comprising:
    first and second side extrusions, each comprising:
        a center portion having first and second ends;
        a first end portion disposed along a first side of said center portion, and extending in a direction substantially perpendicular to said center portion so as to define a first corner with said center portion, said first end portion having a first foot groove in its exterior surface which extends the length of said center portion between its first and second ends; and
        a second end portion disposed along a second opposing side of said center portion, and extending in a direction substantially perpendicular to said center portion, so as to define a second corner with said center portion, said second end portion having a second foot groove in its exterior surface which extends the length of said center portion between its first and second ends;
        wherein said center portion has, in its exterior surface, third and fourth foot grooves which extend the length of said center portion between its first and second ends, the third and fourth foot grooves having a shape and size approximately the same as the first and second foot grooves, said third foot groove disposed near said first corner, and said fourth foot groove disposed near said second corner;
    a front panel, connected to said first end of each of said side extrusions;
    a first surface panel means for securing said first end portion of each of said side extrusions with said first surface panel; and
    a second surface panel means for securing said second end portion of each of with said second surface panel said side extrusions in an opposing fashion relative to said first surface panel.

2. The enclosure of claim 1, further comprising:
    first and second feet, mated with said second foot groove in each of said first and second side extrusions, respectively.

3. The enclosure of claim 2, wherein said first and second feet extend substantially the length of the center portions of said first and second side extrusions, respectively.

4. The enclosure of claim 1, wherein said center portion of each of said first and second side extrusions also has, in its exterior surface, a center groove extending from its first end to its second end.

5. The enclosure of claim 1, wherein said front panel comprises an LCD panel that may be oriented in either of first and second perpendicular directions.

6. The enclosure of claim 1, wherein said center portion of said first side extrusions also has an interior groove for mounting a computer component thereto.

7. The enclosure of claim 1, wherein, for each of said first and second side extrusions, said third and fourth foot grooves are spaced from said first and second corners, respectively, by approximately the same distance as said first and second foot grooves are respectively spaced therefrom.

* * * * *

UNITED STATES PATENT AND TRADEMARK OFFICE
CERTIFICATE OF CORRECTION

PATENT NO. : 5,248,193
DATED : September 28, 1993
INVENTOR(S) : James L. Schlemmer It is certified that error appears in the above-indentified patent and that said Letters Patent is hereby corrected as shown below:

Col. 2, line 44: After "configurations", insert --,--.

Col. 8, lines 41-42: Delete "with said second surface panel".

Col. 8, line 42: After "extrusions", insert --with said second surface panel--.

Signed and Sealed this

Fifth Day of April, 1994

BRUCE LEHMAN

Attest:

Attesting Officer

Commissioner of Patents and Trademarks